(12) United States Patent
Zhou

(10) Patent No.: US 10,756,027 B1
(45) Date of Patent: Aug. 25, 2020

(54) SEMICONDUCTOR STRUCTURE AND METHOD FOR FORMING THE SAME

(71) Applicant: UNITED MICROELECTRONICS CORP., Hsin-Chu (TW)

(72) Inventor: Zhibiao Zhou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/371,077

(22) Filed: Mar. 31, 2019

(30) Foreign Application Priority Data

Mar. 11, 2019 (CN) .......................... 2019 1 0180884

(51) Int. Cl.
| | |
|---|---|
| H01L 21/00 | (2006.01) |
| H01L 29/82 | (2006.01) |
| H01L 23/552 | (2006.01) |
| H01L 27/06 | (2006.01) |
| H01L 27/12 | (2006.01) |
| H01L 23/66 | (2006.01) |
| H01L 21/822 | (2006.01) |
| H01L 27/02 | (2006.01) |
| H01L 21/84 | (2006.01) |
| H01L 27/148 | (2006.01) |

(52) U.S. Cl.
CPC ........ *H01L 23/552* (2013.01); *H01L 21/8221* (2013.01); *H01L 21/84* (2013.01); *H01L 23/66* (2013.01); *H01L 27/0292* (2013.01); *H01L 27/0688* (2013.01); *H01L 27/1203* (2013.01); *H01L 27/14818* (2013.01)

(58) Field of Classification Search
CPC ..................................................... H01L 23/552
USPC ............................... 257/422, 428; 438/61–63
See application file for complete search history.

(56) References Cited

U.S. PATENT DOCUMENTS

| | | | |
|---|---|---|---|
| 6,838,332 B1 | 1/2005 | Sanchez | |
| 7,489,015 B2* | 2/2009 | Stobbs | G11C 7/24 257/433 |
| 7,531,407 B2 | 5/2009 | Clevenger | |
| 7,772,679 B2* | 8/2010 | Chang | H01L 23/552 257/435 |
| 7,948,064 B2 | 5/2011 | Barth | |
| 8,796,046 B2* | 8/2014 | Chen | G11C 11/16 |
| 9,070,692 B2* | 6/2015 | Zhou | H01L 23/552 |
| 9,224,699 B2* | 12/2015 | Jang | H01L 24/73 |
| 10,096,768 B2* | 10/2018 | Jiang | H01L 43/02 |
| 10,34,7826 B1* | 7/2019 | Bhushan | H01L 27/222 |
| 10,475,985 B2* | 11/2019 | Bhushan | H01L 23/295 |
| 2005/0110159 A1 | 5/2005 | Oh | |
| 2008/0073747 A1 | 3/2008 | Chao | |
| 2013/0126226 A1 | 5/2013 | Koster | |

* cited by examiner

*Primary Examiner* — Calvin Lee
(74) *Attorney, Agent, or Firm* — Winston Hsu

(57) ABSTRACT

A semiconductor structure is provided, the semiconductor structure includes a front oxide layer on a backside oxide layer, a front electronic component in the front oxide layer, a backside electronic component in the backside oxide layer, and a shield structure disposed between the front oxide layer and the backside oxide layer, the shield structure includes a patterned buried metal layer, two front contact structures disposed on a front surface of the patterned buried metal layer, and two back contact structures disposed on a backside of the patterned buried metal layer.

20 Claims, 5 Drawing Sheets

10,756,027 B1

SEMICONDUCTOR STRUCTURE AND METHOD FOR FORMING THE SAME

BACKGROUND OF THE INVENTION

1. Field of the Invention

The present invention relates to a semiconductor device having a shield structure, and more particularly, to a semiconductor structure having a shield structure that can reduce the electromagnetic interference (EMI).

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

As is well known in the art, an IC device is produced from dies that are fabricated by conventional semiconductor manufacturing processes. The process to manufacture a die starts with a wafer: first, different regions are marked on the wafer; second, conventional semiconductor manufacture processes such as deposition, photolithography, etching or planarization are used to form needed circuit trace(s); then, each region of the wafer is separated to form a die and packaged to form a chip; finally, the chip is attached onto a board, for example, a printed circuit board (PCB), and the chip is electrically coupled to the pins on the PCB. Thus, each of the programs on the chip can be performed, thereby forming a package body.

In the modern society, current semiconductor devices often include RF circuit to perform wireless communication capabilities. However, there is often strong EMI generated by the RF circuit, which would interfere other around circuits. It is a serious problem which is urged to be resolved.

SUMMARY OF THE INVENTION

The present invention provides a semiconductor structure, the semiconductor structure includes a front oxide layer disposed on a backside oxide layer, a front electronic component disposed in the front oxide layer, a backside electronic component disposed in the backside oxide layer, a shield structure disposed between the front oxide layer and the backside oxide layer, wherein the shield structure comprises a patterned buried metal layer, two front contact structures disposed on a front surface of the patterned buried metal layer, and two backside contact structures disposed on a backside of the patterned buried metal layer.

The present invention further provides a method for forming a semiconductor structure, the method including: first, a front oxide layer and a backside oxide layer are formed, wherein the front oxide layer is disposed on the backside oxide layer, a front electronic component is formed in the front oxide layer, a backside electronic component is formed in the backside oxide layer, a shield structure is formed between the front oxide layer and the backside oxide layer, wherein the shield structure comprises a patterned buried metal layer. Next, two front contact structures are formed on a front surface of the patterned buried metal layer, and two backside contact structures are formed on a backside of the patterned buried metal layer.

One feature of the present invention is that a patterned buried metal layer is formed between the first oxide layer (front oxide layer) and the second oxide layer (backside oxide layer), and the patterned buried metal layer can simultaneously serve as a portion of the front side shield structure and a portion of the backside shield structure. In other words, at least two front contact structures are formed on the front surface of the substrate, electrically connected to the patterned buried metal layer, and at least one electronic component is surrounded by the two front contact structures and the patterned buried metal layer, to achieve the effect of preventing electromagnetic interference of the electronic component. Similarly, at least two backside contact structures are formed on the back surface of the substrate, electrically connected to the patterned buried metal layer, and at least one electronic component is surrounded by the two backside contact structures and the patterned buried metal layer, to achieve the effect of preventing electromagnetic interference of the electronic component.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a method for manufacturing a semiconductor structure with shielding layer structure provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
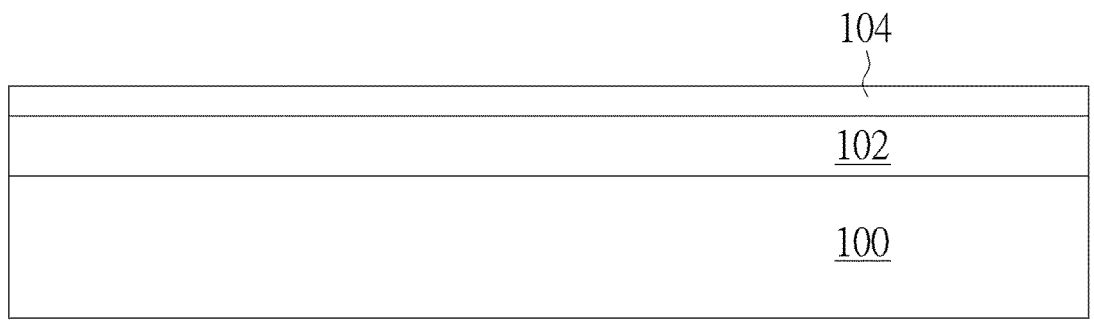

Please refer to FIG. 1 to FIG. 9, FIGS. 1-9 are schematic drawings illustrating a method for manufacturing a semiconductor structure with shielding layer structure provided by a preferred embodiment of the present invention. As shown in FIG. 1, a substrate 100 is provided, and a first oxide layer 102 and a metal layer 104 are formed on the substrate 100. The material of the substrate 100 is, for example, a silicon substrate, an epitaxial silicon substrate, a silicon germanium substrate or a silicon carbide substrate. The material of the first oxide layer 102 is preferably silicon oxide, but is not limited thereto, and the first oxide layer 102 may also contain silicon oxynitride or other insulating layer. The material of the metal layer 104 comprises a metal or a metal-containing compound, such as tungsten (W), silicon tungsten (WSi), titanium (Ti), titanium nitride (TiN), tantalum (Ta), tantalum nitride (TaN).), nickel (Ni), iron (Fe), cobalt (Co), etc., but are not limited thereto, and other conductive materials not mentioned here may also be used as the material of the metal layer 104.

The metal layer 104 described herein will be fabricated as a shield layer between two oxide layers in subsequent steps, the shield layer has the function of blocking electromagnetic interference from components such as radio frequency circuits. The details will be as described in the subsequent paragraphs.

Figure 2:
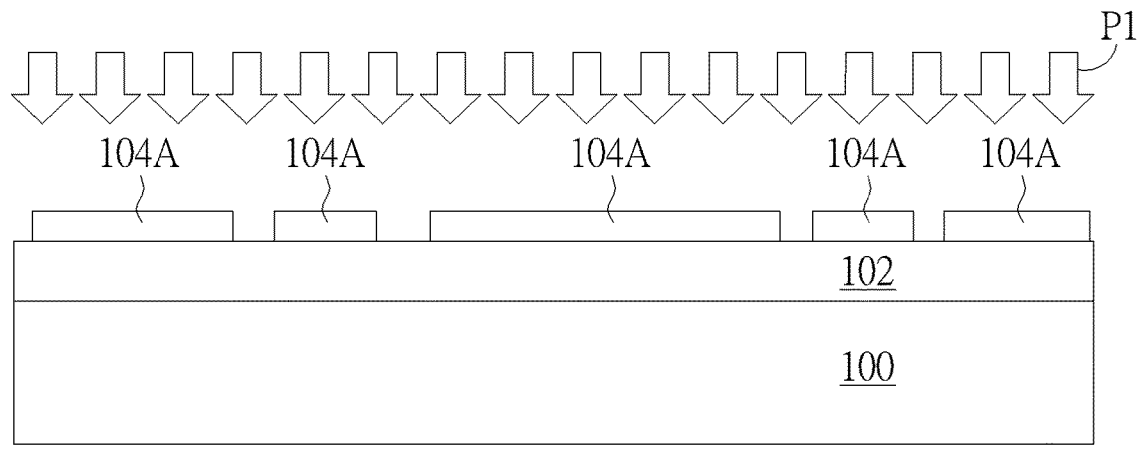

As shown in FIG. 2, a lithography etching step P1 is performed on the metal layer 104, the lithography etching step P1 includes forming a patterned photoresist layer (not shown) on a portion of the metal layer 104, and then an etching step is performed to remove a portion of the metal layer 104 that is not covered by the photoresist layer, and leaves the remaining portion of the metal layer 104 required in the subsequent step, and the photoresist layer is then removed. Here, the remaining metal layer 104 is defined as a patterned buried metal layer 104A. In the subsequent steps, the patterned buried metal layer 104A will be located between two insulating layers (oxide layers) and electrically connected to the contact structures, so as to form a shield structure that surrounds the electronic components. More detailed steps will be explained in the following paragraphs.

Figure 3:
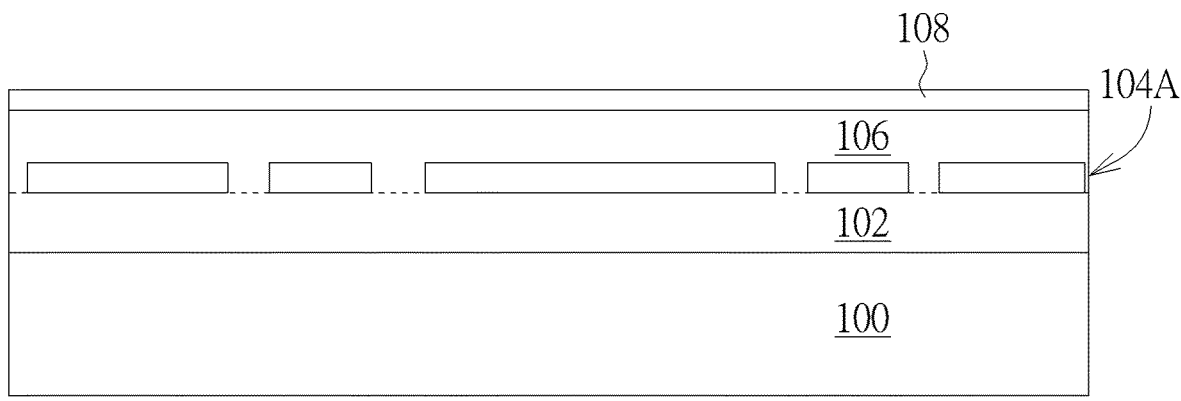

Referring to FIG. 3, after the patterned buried metal layer 104A is completed, a second oxide layer 106 is formed to cover the first oxide layer 102 and the patterned buried metal layer 104A. In some embodiments, a planarization step may be further performed to make the second oxide layer 106 has a flat top surface, but is not limited thereto. In addition, a portion of the second oxide layer 106 directly contacts the first oxide layer 102.

As shown in FIG. 3, a semiconductor layer 108 is formed on the second oxide layer 106, wherein the semiconductor layer 108 is, for example, silicon. The semiconductor layer 108 herein can be used as a channel layer of an electronic component such as a transistor. The method for forming the semiconductor layer 108 is, for example, taking another silicon wafer (not shown), wherein an oxide layer is selectively formed on the silicon wafer, and the silicon or the oxide layer is bonded to the second oxide layer 106. A heating and a pressurizing step are performed to tightly bond the silicon wafer to the second oxide layer 106. The above method is a technique known in the art, and will not be further described herein.

In this step, the present invention has formed a special silicon on insulating (SOI) substrate. It is characterized in that it further comprises a patterned buried metal layer 104A located within the insulating layer (i.e., the first oxide layer 102 and the second oxide layer 106). In more detail, after the second oxide layer 106 is completed, the patterned buried metal layer 104A will be located between the first oxide layer 102 and the second oxide layer 106. One difference between the present invention and the conventional SOI semiconductor substrate is that in the conventional process, the first oxide layer 102 and the second oxide layer 106 are simultaneously fabricated and used as one single insulating layer, for example, an insulating layer of the SOI structure. In the present invention, the step of forming the insulating layer (oxide layer) is sequentially divided into two parts, and after the step of forming the first insulating layer, a patterned buried metal layer 104A is formed. Therefore, the patterned buried metal layer 104A is located between the two insulating layers (oxide layers). The patterned buried metal layer 104A can serve as a shield structure for subsequently formed electronic components.

Figure 4:
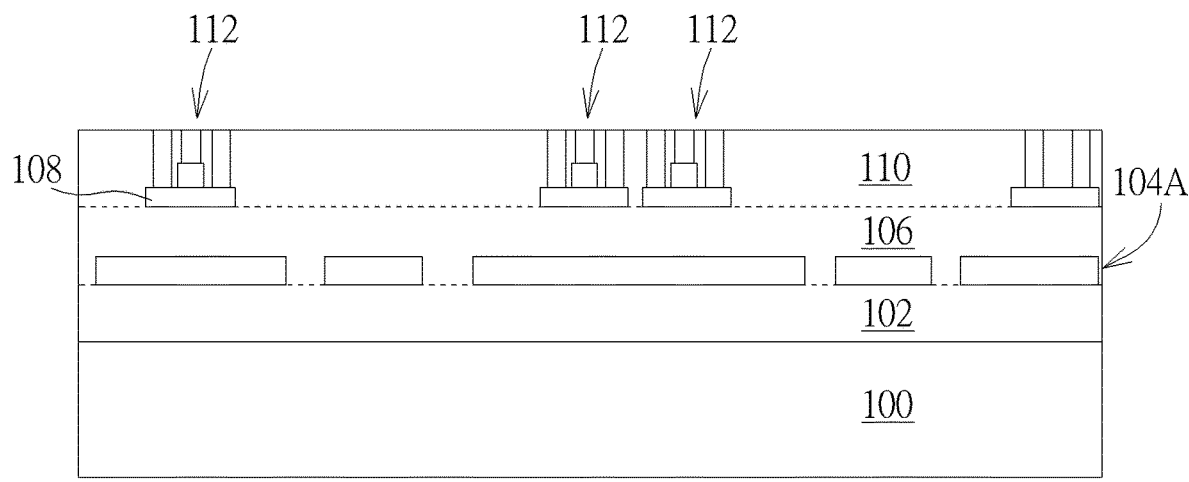

Next, as shown in FIG. 4, a region (for example, an active area) for subsequently forming an electronic component is defined. Next, a portion of the semiconductor layer 108 is removed, and then a dielectric layer 110 is formed to cover the second oxide layer 106 and the semiconductor layer 108. Afterwards, at least one electronic component 112 is formed in the dielectric layer 110 and on the remaining semiconductor layer 108. The material of the dielectric layer 110 described herein is, for example, silicon oxide or silicon nitride, but is not limited thereto, and the electronic component 112 may include a transistor, a contact structure, or radio frequency circuits composed of a plurality of active components, a plurality of passive components and a plurality of transistors. In the present invention, the radio frequency circuit is a circuit capable of emitting or receiving radio waves of a certain frequency, for example, a radio wave of 900 MHz to 1900 MHz is used in a cell phone communication circuit, or a wave of 2.4 GHz is used for a bluetooth communication circuit, or the 6 GHz radio waves that can be used in other systems.

Figure 5:
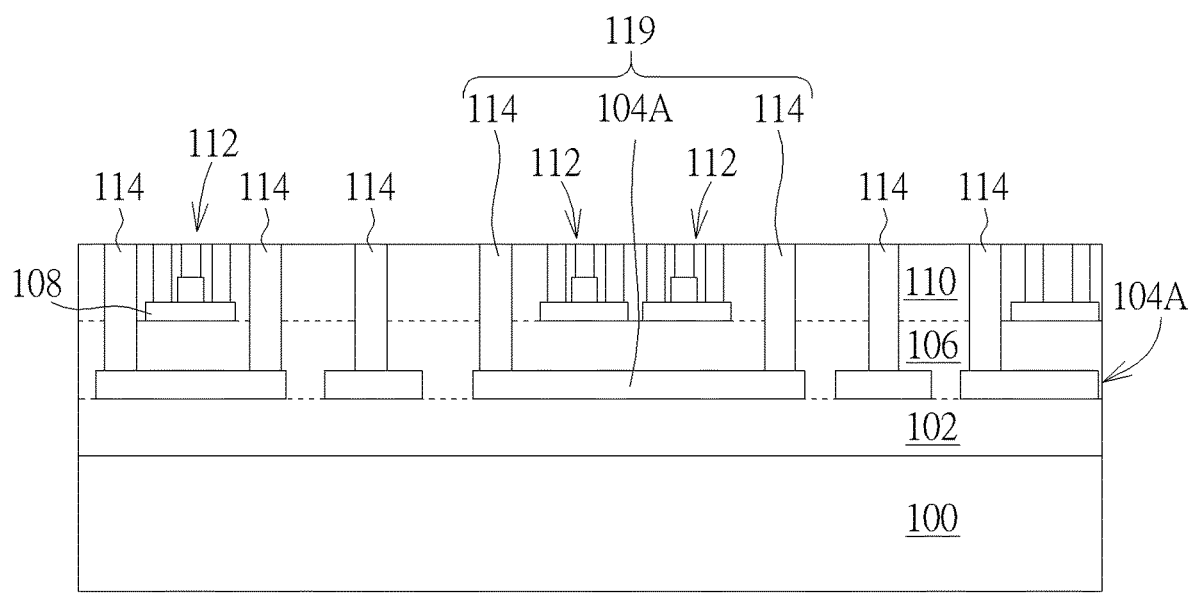

As shown in FIG. 5, a plurality of front contact structures 114 are formed in the dielectric layer 110 and the second oxide layer 106, wherein at least some of the front contact structures 114 are electrically connected to the patterned buried metal layer 104A, and at least one of the electronic component 112 is located between the patterned buried metal layer 104A and the two front contact structures 114. That is, after the front contact structures 114 are electrically connected to the patterned buried metal layer 104A, they are collectively combined into a shield structure 119. In the subsequent process, the shield structure 119 is grounded (for example, by connected to the front contact structure 114 and a ground terminal). Therefore, the shield structure 119 is a device having the effect of electromagnetic discharge protection (ESD).

Figure 6:
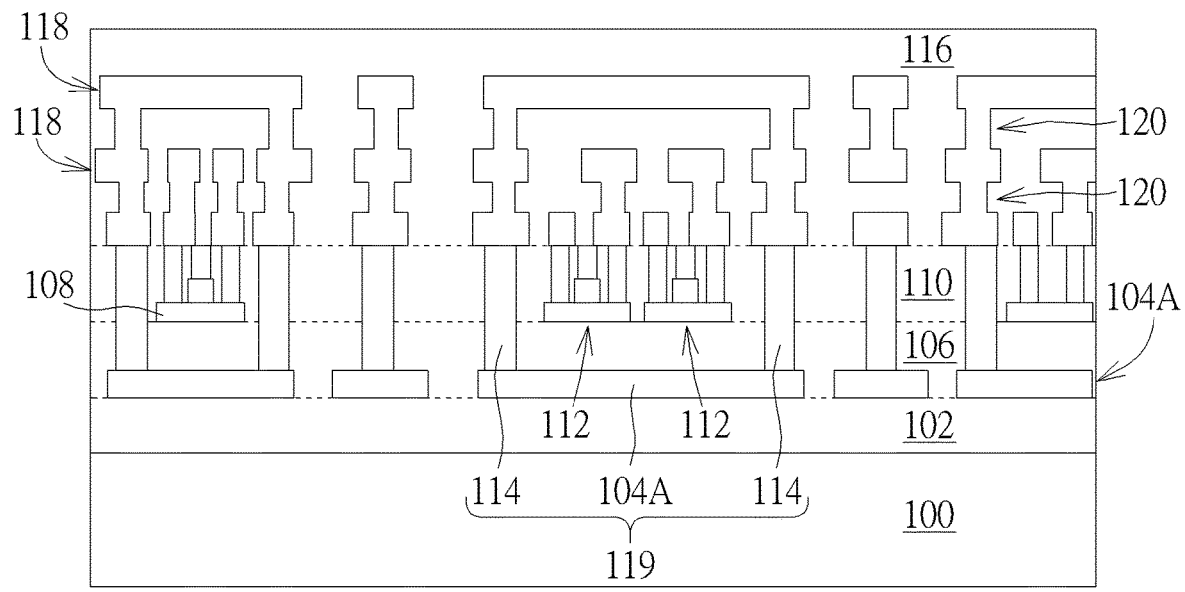

As shown in FIG. 6, after the front contact structure 114 is completed, a dielectric layer 116 is formed on the dielectric layer 110, and a plurality of metal traces 118 and a plurality of conductive vias 120 are formed in the dielectric layer 116. The metal traces 118 and the conductive vias 120 are electrically connected to the electronic components 112 and the front contact structures 114. In this embodiment, the metal traces 118 and the conductive vias 120 electrically connected to the electronic component 112 are used as a metal interconnection to connect other electronic components such as capacitors, resistors or control components. The metal trace 118 and the conductive via 120 electrically that is connected to the front contact structure 114 can be connected to a ground signal, thereby making the shielding structure 119 (that is, the patterned buried metal layer 104A and the front contact structure 114) ground.

It is also worth noting that the front contact structures 114 is part of the metal interconnect system, that is, the front contact structure 114 can be formed together with the metal traces 118 or the conductive vias 120 through the same metal interconnect process, but the front contact structure 114 is not electrically connected to the metal traces 118 or the conductive vias 120. In an embodiment of the invention, the front contact structure 114 is only electrically connected to the patterned buried metal layer 104A. In addition, the material of the metal trace 118 and the conductive via 120 is, for example, copper or other suitable conductive material.

In the subsequent steps, other electronic components, such as capacitors, storage node contact structures, and the like, may be formed to connect the metal traces 118 and the conductive vias 120 described above. In order to simplify the drawings, the subsequently formed electronic components are not shown in the drawings, and the electronic components are known in the art, and will not be further described herein.

Figure 7:
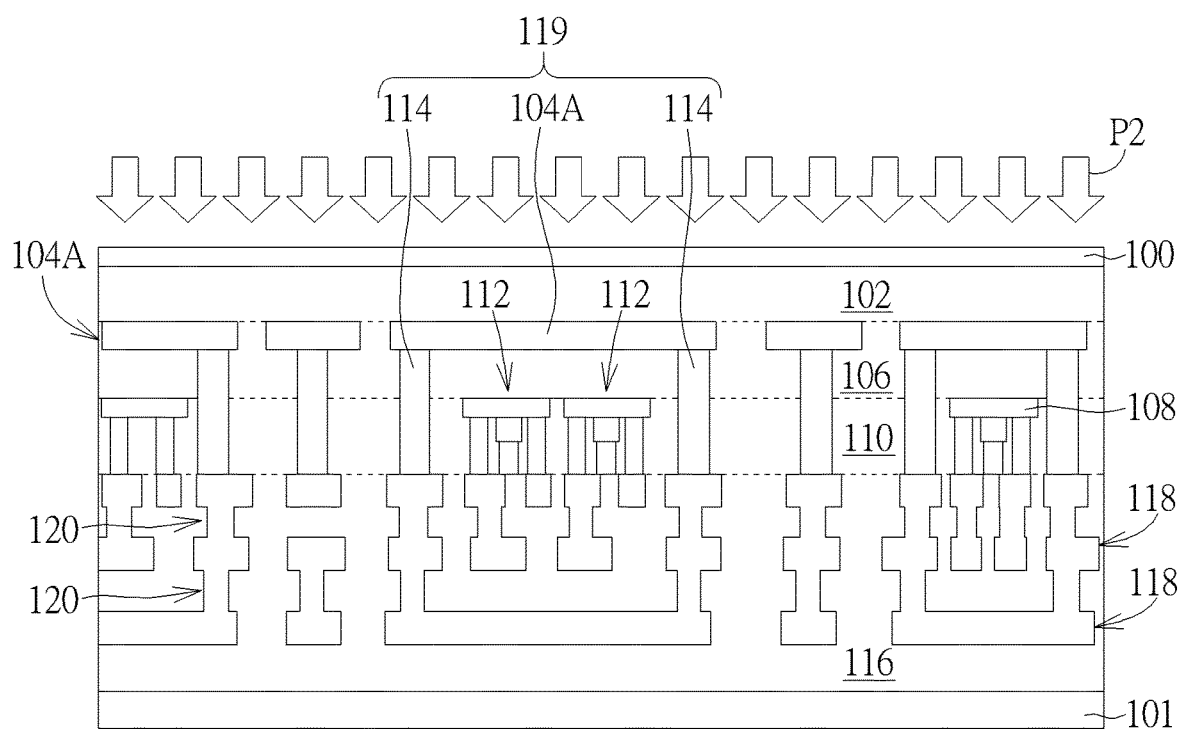

Until the step of FIG. 6 mentioned above, each component is formed on one side of the substrate 100 (for example, defined as a front side), and in the embodiment of the present invention, other components may be formed on the other side of the substrate (for example, defined as the back side). That is, components are formed on both the front side and the back side of the same substrate 100 to increase the density of the components. As shown in FIG. 7, the structure shown in FIG. 6 is turned upside down (or flipped), and then a thinning step P2 is performed on the substrate 100, such as a chemical mechanical polishing (CMP) or other suitable steps. After the thinning step P2 is completed, the thickness of the substrate 100 becomes thinner. The material of the substrate 100 in this embodiment comprises semiconductor material such as silicon, and the substrate 100 can be directly used as a channel layer of a back surface electronic components (for example, transistors). In other words, the thinned substrate 100 has the function similar to the semiconductor layer 108 shown in FIG. 3 mentioned above. In addition, the flipped semiconductor structure can be temporarily disposed on a carrier substrate 101, and in the subsequent steps, when the semiconductor structure is completed, it will be separated from the carrier substrate 101.

Figure 8:
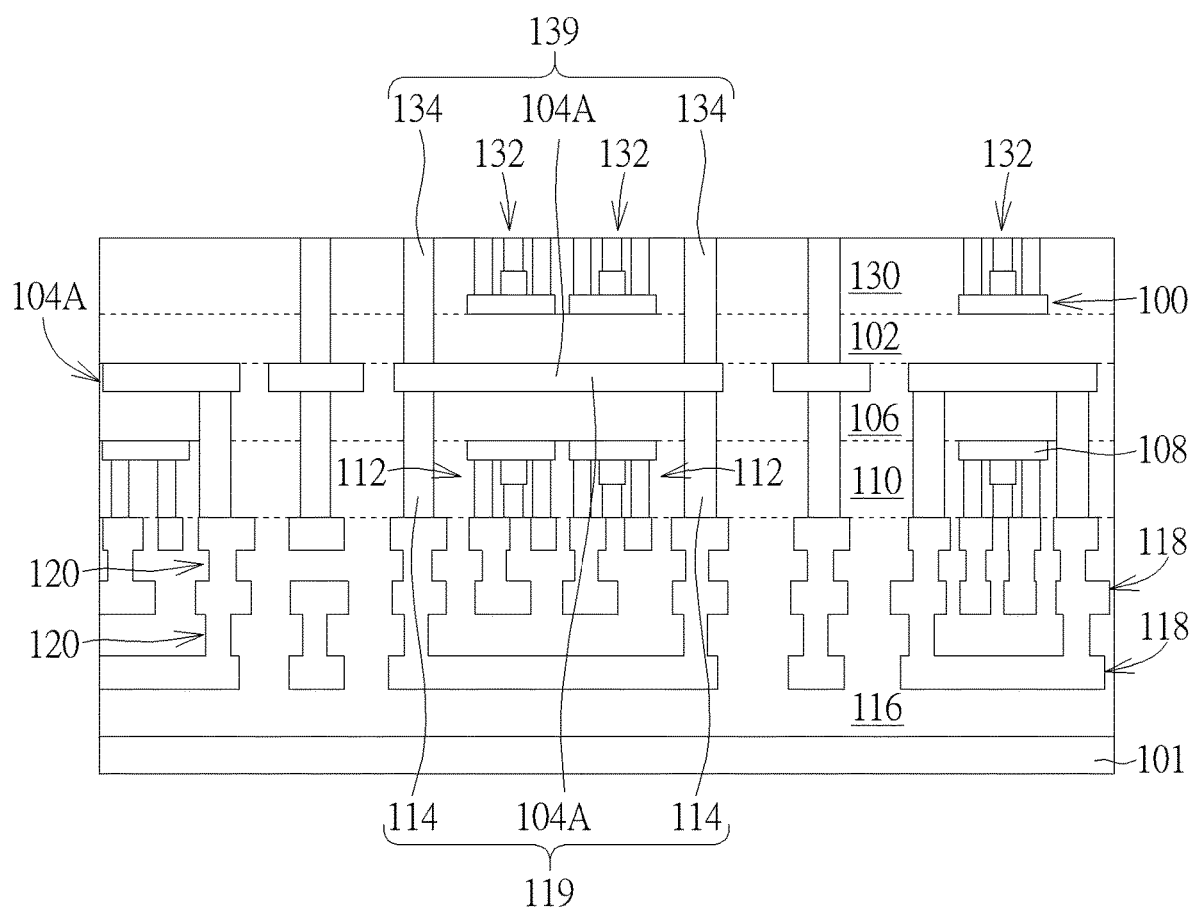

Next, the electronic components and the shield structure are continuously formed on the back surface of the substrate 100. As shown in FIG. 8, the thinned substrate 100 is used as a channel layer, and a portion of the substrate 100 is removed, for example, only leaving the substrate 100 in the active region, and then a dielectric layer 130 is formed on the first oxide layer 112, and a plurality of electronic components 132 are formed on the substrate 100 and in the dielectric layer 130. Next, a plurality of backside contact structures 134 are formed in the dielectric layer 130 and in the first oxide layer 102. Each electronic component 132 may be the same as or different from the electronic component 112 formed on the front surface of the substrate 100, and may include a transistor, a contact structure, or a radio frequency circuit composed of a plurality of transistors and other active or passive components.

The backside contact structure 134 also has the similar structure and the similar function to that of the front contact structure 114. A plurality of backside contact structures 134 are formed in the dielectric layer 130 and the first oxide layer 102, wherein at least some of the backside contact structures 134 are electrically connected to the patterned buried metal layer 104A, and at least one electronic component 132 is disposed between the patterned buried metal layer 104A and two backside contact structures 134. That is, after the backside contact structures 134 are electrically connected to the patterned buried metal layer 104A, the backside contact structures 134 and the patterned buried metal layer 104A constitute a shield structure 139. In the subsequent process, the shield structure 139 is grounded (for example, by connected to the backside contact structure 134 and a ground terminal), so the shield structure 139 is a device having the effect of electromagnetic discharge protection (ESD). In another embodiment of the present invention, since parts of the shield structure 139 is electrically connected to the shield structure 119 mentioned above, if the shield structure 119 have already grounded, the backside contact structures 134 of the shield structure 139 does not need to be connected to the ground signal.

In this embodiment, the material of the dielectric layer 130 is, for example, silicon oxide or silicon nitride, or other suitable insulating materials. In this embodiment, the dielectric layer 110, the dielectric layer 130, the first oxide layer 102 and the second oxide layer 106 are made of silicon oxide. The backside contact structure 134 is preferably made of copper or other suitable conductive material.

Figure 9:
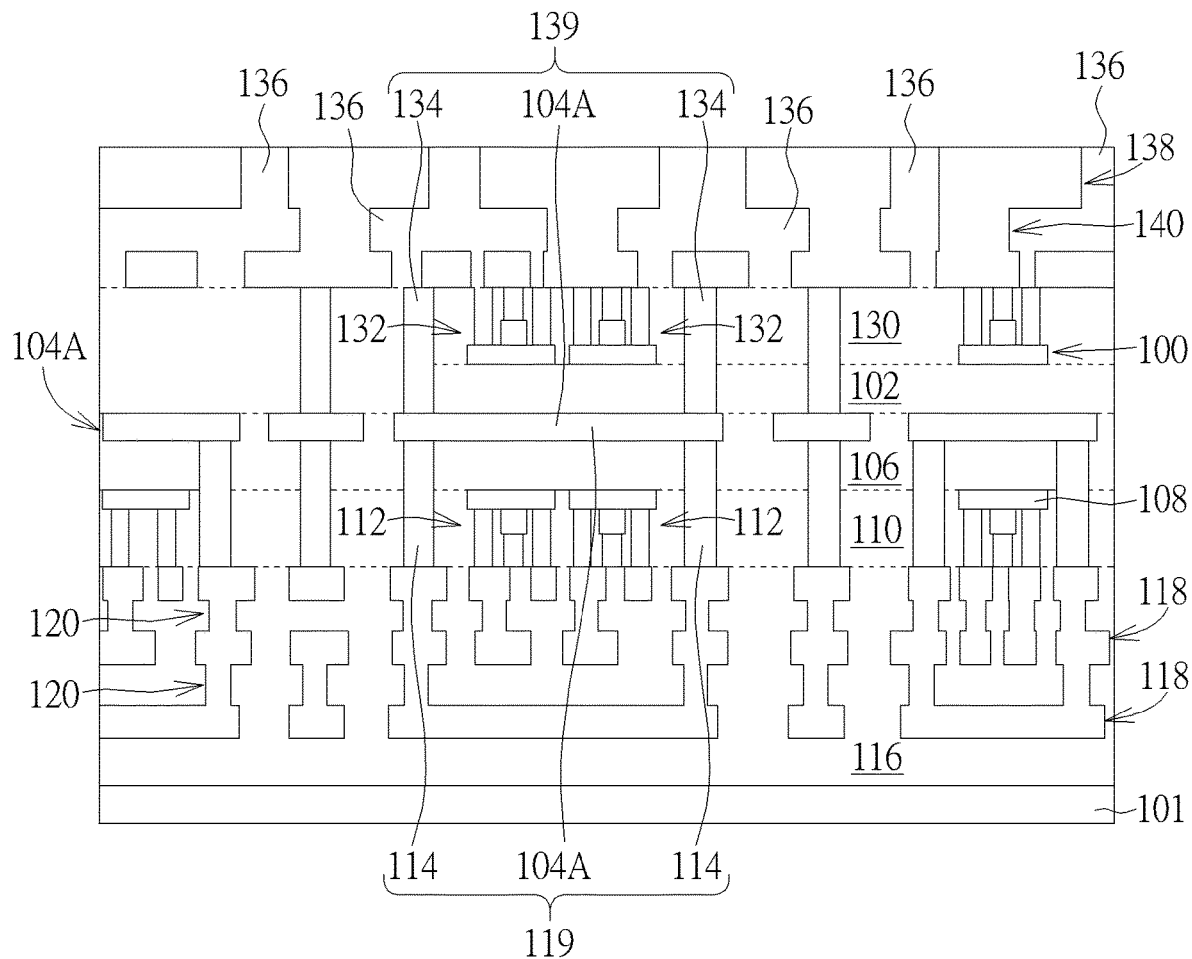

Finally, as shown in FIG. 9, a dielectric layer 136 is formed on the dielectric layer 130, and a plurality of metal traces 138 and a plurality of conductive vias 140 are formed in the dielectric layer 136. Some of the metal trace 138 and the conductive via 140 are electrically connected to the electronic component 132 and the backside contact structure 134. In this embodiment, the metal traces 138 and the conductive vias 140 electrically connected to the electronic component 132 are used as a metal interconnection to connect other electronic components such as capacitors, resistors or control components. In some embodiments, the metal traces 138 and the conductive vias 140 electrically connected to the backside contact structure 134 are selectively connected to a ground signal, thereby making the shield structure (that is, the patterned buried metal layer 104A and the backside contact structures 134) is grounded.

In the subsequent steps, other electronic components, such as capacitors, storage node contact structures, etc., may be formed to connect the metal traces 138 and the conductive vias 140 described above. In order to simplify the drawings, the subsequently formed electronic components are not shown in the drawings, and the electronic components are known in the art, and will not be further described herein.

In one of the features of the present invention, referring to FIG. 9, a patterned buried metal layer 104A is formed between the first oxide layer 102 and the second oxide layer 106. The patterned buried metal layer 104A can be simultaneously used as a portion of the front shield structure 119 and a portion of the backside shield structure 139. In other words, at the front side of the substrate 100, at least two front contact structures 114 are formed, electrically connected to the patterned buried metal layer 104A, and at least one electronic component 112 is surrounded by the two front surface structures 114 and the patterned buried metal layer 104A, to achieve the effect of preventing electromagnetic interference of the electronic component 112. Similarly, at least two backside contact structures 134 are formed on the back surface of the substrate 100, electrically connected to the patterned buried metal layer 104A, and at least one electronic component 132 is surrounded by the two backside contact structures 134 and the patterned buried metal layer 104A, to achieve the effect of preventing electromagnetic interference of the electronic component 132. As seen from the cross-sectional view (FIG. 9), the shield structure 119 partially overlaps the shield structure 139, that is, the two front contact structures (e.g., the front contact structure 114A and the front contact structure 114B in FIG. 9), the two backside contact structures (for example, the backside contact structure 134A and the backside contact structure 134B in FIG. 9) and the patterned buried metal layer 104A are directly in contact with each other, to form an "H" shaped cross-sectional structure, but in this embodiment The front contact structures 114 and the backside contact structures 134 do not need to be aligned in the vertical direction, and the positions of the front contact structures and the backside contact structures can be adjusted according to actual requirements.

Compared with the prior art, the present invention forms a patterned buried metal layer in the oxide layer, and combines the front contact structures and the backside contact structures with the patterned buried metal layer to form a front shield structure and a backside surface shield structure. The shielding effect of the element on the front side of the substrate and the backside of the substrate can be provided, to increase the stability of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   forming a front oxide layer and a backside oxide layer, wherein the front oxide layer is disposed on the backside oxide layer;
   forming a front electronic component in the front oxide layer;
   forming a backside electronic component in the backside oxide layer;
   forming a shield structure between the front oxide layer and the backside oxide layer, wherein the shield structure comprises a patterned buried metal layer;
   forming two front contact structures on a front surface of the patterned buried metal layer; and
   forming two backside contact structures on a backside of the patterned buried metal layer, wherein the front oxide layer, the backside oxide layer, the two front contact structures and the two backside contact structures directly contact the shield structure simultaneously.

2. The method of claim 1, wherein the material of the patterned buried metal layer comprises tungsten (W), tungsten telluride (WSi), titanium (Ti), titanium nitride (TiN), tantalum (Ta), tantalum nitride (TaN), nickel (Ni), iron (Fe), cobalt (Co).

3. The method of claim 1, wherein at least one of the front electronic component and the backside electronic component comprises a transistor.

4. The method of claim 1, wherein the shield structure is grounded.

5. The method of claim 1, wherein the two back contact structures are located in the backside oxide layer and electrically connected to the patterned buried metal layer.

6. The method of claim 5, further comprising a plurality of backside conductive traces disposed under the backside oxide layer, and a portion of the backside conductive traces are electrically connected to the shield structure by at least one backside contact structure.

7. The method of claim 5, wherein the back electronic component is located between the two backside contact structures and the patterned buried metal layer.

8. The method of claim 1, wherein the two front contact structures are located in the front oxide layer and electrically connected to the patterned buried metal layer.

9. The method of claim 8, further comprising a plurality of front conductive traces disposed on the front oxide layer, and a portion of the front conductive traces are electrically connected to the shield structure by at least one front contact structure.

10. The method of claim 8, wherein the front electronic component is located between the two front contact structures and the patterned buried metal layer.

11. A semiconductor structure, comprising:
    a front oxide layer disposed on a backside oxide layer;
    a front electronic component disposed in the front oxide layer;
    a backside electronic component disposed in the backside oxide layer;
    a shield structure disposed between the front oxide layer and the backside oxide layer, wherein the shield structure comprises a patterned buried metal layer;
    two front contact structures disposed on a front surface of the patterned buried metal layer; and
    two backside contact structures disposed on a backside of the patterned buried metal layer, wherein the front oxide layer, the backside oxide layer, the two front contact structures and the two backside contact structures directly contact the shield structure simultaneously.

12. The semiconductor structure of claim 11, wherein the material of the patterned buried metal layer comprises tungsten (W), tungsten telluride (WSi), titanium (Ti), titanium nitride (TiN), tantalum (Ta), tantalum nitride (TaN), nickel (Ni), iron (Fe), cobalt (Co).

13. The semiconductor structure of claim 11, wherein at least one of the front electronic component and the backside electronic component comprises a transistor.

14. The semiconductor structure of claim 11, wherein the shield structure is grounded.

15. The semiconductor structure of claim 11, wherein the two back contact structures are located in the backside oxide layer and electrically connected to the patterned buried metal layer.

16. The semiconductor structure of claim 15, further comprising a plurality of backside conductive traces disposed under the backside oxide layer, and a portion of the backside conductive traces are electrically connected to the shield structure by at least one backside contact structure.

17. The semiconductor structure of claim 15, wherein the back electronic component is located between the two backside contact structures and the patterned buried metal layer.

18. The semiconductor structure of claim 11, wherein the two front contact structures are located in the front oxide layer and electrically connected to the patterned buried metal layer.

19. The semiconductor structure of claim 18, further comprising a plurality of front conductive traces disposed on the front oxide layer, and a portion of the front conductive traces are electrically connected to the shield structure by at least one front contact structure.

20. The semiconductor structure of claim 18, wherein the front electronic component is located between the two front contact structures and the patterned buried metal layer.

* * * * *